(12) United States Patent
Liu et al.

(10) Patent No.: US 10,483,294 B2
(45) Date of Patent: Nov. 19, 2019

(54) ARRAY SUBSTRATE, MANUFACTURING METHOD THEREOF AND DISPLAY DEVICE

(71) Applicant: BOE Technology Group Co., Ltd., Beijing (CN)

(72) Inventors: Xiaodi Liu, Beijing (CN); Gang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/908,652

(22) PCT Filed: Sep. 18, 2015

(86) PCT No.: PCT/CN2015/089997
§ 371 (c)(1),
(2) Date: Jan. 29, 2016

(87) PCT Pub. No.: WO2016/150122
PCT Pub. Date: Sep. 29, 2016

(65) Prior Publication Data
US 2017/0033131 A1    Feb. 2, 2017

(30) Foreign Application Priority Data

Mar. 25, 2015 (CN) .......................... 2015 1 0132293

(51) Int. Cl.
*H01L 27/12*    (2006.01)

(52) U.S. Cl.
CPC ...... *H01L 27/1255* (2013.01); *H01L 27/1288* (2013.01)

(58) Field of Classification Search
CPC ...................................................... H01L 21/00
See application file for complete search history.

(56) References Cited

U.S. PATENT DOCUMENTS

| 6,115,089 A * | 9/2000 | Hayashi ............ G02F 1/136213 349/39 |
| 7,550,327 B2 * | 6/2009 | Lee ..................... G02F 1/13458 257/59 |

(Continued)

FOREIGN PATENT DOCUMENTS

| CN | 102768992 A | 11/2012 | |
| CN | 102945828 A * | 2/2013 | ............. H01L 21/77 |

(Continued)

OTHER PUBLICATIONS

Dec. 14, 2015—(WO)—International Search Report and Written Opinion Appn PCT/CN2015/089997 with English Tran.

(Continued)

*Primary Examiner* — Kyoung Lee
*Assistant Examiner* — Christina A Sylvia
(74) *Attorney, Agent, or Firm* — Banner & Witcoff, Ltd.

(57) ABSTRACT

An array substrate, a manufacturing method thereof and a display device are disclosed. The array substrate comprises a gate electrode layer, an active layer and a source-drain electrode layer that are disposed on a substrate. The substrate comprises a storage capacitance region thereon II. In the storage capacitance region II, projections of the gate electrode layer and the active layer on the substrate are at least partially overlapped, and projections of the active layer and the source-drain electrode layer on the substrate are at least partially overlapped. The array substrate can effectively increase the storage capacitance without increasing an area occupied by the storage capacitance region, which is advantageously to reduce a pixel area and increase PPI.

10 Claims, 4 Drawing Sheets

(56) References Cited

U.S. PATENT DOCUMENTS

| | | | |
|---|---|---|---|
| 8,940,562 B1* | 1/2015 | Li | H01L 51/0004 257/E21.499 |
| 2002/0105603 A1 | 8/2002 | Yoo et al. | |
| 2003/0116764 A1 | 6/2003 | Fujikawa et al. | |
| 2004/0126917 A1 | 7/2004 | Yoo et al. | |
| 2005/0095759 A1* | 5/2005 | Cho | H01L 27/124 438/158 |
| 2008/0117347 A1* | 5/2008 | Zhang | G02F 1/136213 349/42 |
| 2009/0153056 A1 | 6/2009 | Chen et al. | |
| 2009/0173712 A1* | 7/2009 | Lee | G01R 1/06727 216/11 |
| 2009/0179831 A1 | 7/2009 | Yamashita et al. | |
| 2012/0241746 A1* | 9/2012 | Xie | H01L 27/1248 257/59 |
| 2013/0334502 A1 | 12/2013 | Liu | |
| 2014/0374740 A1* | 12/2014 | Lou | H01L 27/1225 257/43 |
| 2016/0247837 A1 | 8/2016 | Shi et al. | |

FOREIGN PATENT DOCUMENTS

| | | |
|---|---|---|
| CN | 102945828 A | 2/2013 |
| CN | 103928470 A | 7/2014 |
| CN | 104064688 A | 9/2014 |
| CN | 104701328 A | 6/2015 |
| EP | 2743983 A1 | 6/2014 |
| KR | 20070115235 A | 12/2007 |

OTHER PUBLICATIONS

Apr. 27, 2017—(CN) Second Office Action Appn 201510132293.3 with English Tran.

Oct. 9, 2018—(EP) Extended European Search Report Appn No. 15832676.9.

Feb. 28, 2017—(CN) First Office Action Appn 201510132293.3 with English Tran.

* cited by examiner

ARRAY SUBSTRATE, MANUFACTURING METHOD THEREOF AND DISPLAY DEVICE

The application is a U.S. National Phase Entry of International Application No. PCT/CN2015/089997 filed on Sep. 18, 2015, designating the United States of America and claiming priority to Chinese Patent Application No. 201510132293.3 filed on Mar. 25, 2015. The present application claims priority to and the benefit of the above-identified applications and the above-identified applications are incorporated by reference herein in their entirety.

TECHNICAL FIELD

Embodiments of the present disclosure relate to an array substrate, a manufacturing method thereof and a display device.

BACKGROUND

Recently, display technologies have been developed rapidly. For example, Thin film transistor (simply referred as TFT) technologies have been developed from amorphous silicon thin-film transistors in the past to low temperature Poly-Si thin film transistors, metal oxide semiconductor thin film transistors and so on currently. Phosphor technologies have been developed from liquid crystal display (simply referred as LCD) technologies in the past to organic light emitting diode (simply referred as OLED) technologies currently.

Oxide semiconductors are highly regarded. Large-sized oxide panels are currently in a phase of mass production and backplane performance promotion. Mass produced oxide backplanes are substantially etch-stopper layer (simply referred as ESL) structures. Because a display screen is required to have a high definition all the time, it requires a pixel area to be reduced continuously and Pixels Per Inch (simply referred as PPI) to be increased. However, the pixel area being reduced continuously would lead to a problem of process complexity and reliability, and storage capacitance being continuously decreased.

SUMMARY

An embodiment of the disclosure provides an array substrate, comprising a gate electrode layer, an active layer and a source-drain electrode layer that are disposed on a substrate, wherein: the substrate comprises a storage capacitance region thereon, in the storage capacitance region, projections of the gate electrode layer and the active layer on the substrate are at least partially overlapped, and projections of the active layer and the source-drain electrode layer on the substrate are at least partially overlapped.

For example, the array substrate further comprises a gate insulation layer between the gate electrode layer and the active layer and a etch-stopper layer between the active layer and the source-drain electrodes layer, wherein the gate electrode layer comprises a portion in the storage capacitance region, the gate insulation layer comprises a portion in the storage capacitance region; the active layer comprises a portion in the storage capacitance region; the etch-stopper layer comprises a portion in the storage capacitance region; the source-drain electrode layer comprises a portion in the storage capacitance region.

For example, the substrate further comprises a thin film transistor region, and a thickness of the gate insulation layer formed in the storage capacitance is smaller than a thickness of the gate insulation layer formed in the thin film transistor region.

For example, the gate insulation layer at a contact hole in the gate insulation layer is in contact with the source-drain electrode layer.

For example, at least one passivation layer is formed on the source-drain electrode layer, and a material of the passivation layer is one or more of silicon oxide, silicon nitride, silicon oxynitride, or alumina.

For example, a pixel electrode layer is formed on the passivation layer, and the pixel electrode layer is in contact with the source-drain electrode layer by a contact hole in the passivation layer which runs through the passivation layer.

An embodiment of the disclosure provides a method of manufacturing an array substrate, the method comprising: forming a gate electrode layer, an active layer and a source-drain electrode layer on a substrate, wherein the substrate comprises a storage capacitance region thereon; in the capacitance storage region, projections of the gate electrode layer and the active layer on the substrate are at least partially overlapped, and projections of the active layer and the source-drain electrode layer on the substrate are at least partially overlapped.

For example, a gate insulation layer is formed between the gate electrode layer and the active layer, and an etch-stopper layer is formed between the active layer and the source-drain electrode layer, wherein when the gate electrode layer is formed, a portion in the storage capacitance region is formed; when the gate insulation layer is formed, a portion in the storage capacitance region is formed; when the active layer is formed, a portion in the storage capacitance region is formed; when the etch-stopper layer is formed, a portion in the storage capacitance region is formed; and when the source-drain electrode layer is formed, a portion in the storage capacitance region is formed.

For example, the method further comprises etching the gate insulation layer in the storage capacitance region to be thinned, after the gate insulation layer is formed.

For example, a thickness of the gate insulation layer in the storage capacitance region is controlled by controlling an etching time when the gate insulation layer in the storage capacitance is etched to be thinned.

For example, the method further comprises etching the gate insulation layer at a contact hole predetermined to be formed in the gate insulation layer to thinned, while etching the gate insulation layer in the storage capacitance region to be thinned.

For example, the method further comprises etching the gate insulation layer at the contact hole predetermined to be formed in the gate insulation layer again so as to reach the gate electrode layer, while forming the etch-stopper layer on the active layer, and the gate insulation layer at the contact hole in the gate insulation layer is in contact with the source-drain electrode layer.

For example, the method further comprises: at least one passivation layer being formed on the source-drain electrode layer, and a material of the passivation layer being one or more of silicon oxide, silicon nitride, silicon oxynitride, or alumina.

For example, the method further comprises: forming a contact hole in the at least one passivation layer which runs through the at least one passivation layer and forming a pixel electrode on the at least one passivation layer, and the pixel electrode is in contact with the source-drain electrode layer by the contact hole in the passivation layer.

For example, the pixel electrode layer is cured and annealed, after the pixel electrode layer is formed.

An embodiment of the disclosure provides a display device, comprising the above-mentioned array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 8:
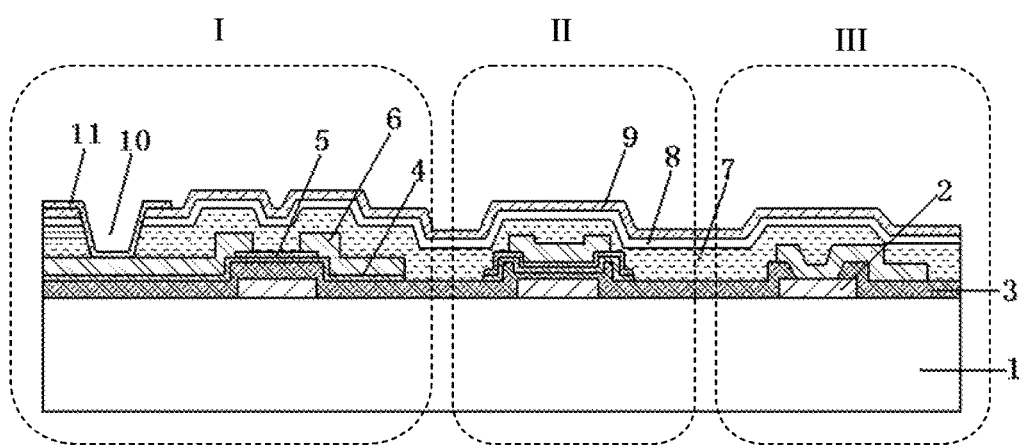
FIG. 8 is a schematic diagram of forming a pixel electrode layer provided by the embodiment of the disclosure.

An embodiment of the present disclosure provides an array substrate. As shown in FIG. 8, the array substrate comprises a gate electrode layer 2, an active layer 4 and a source-electrode layer 6 that are disposed on a substrate 1 sequentially.

The substrate 1 comprises a storage capacitance region II thereon.

In the storage region II, projections of the gate electrode layer 2 and the active layer 4 on the substrate 1 are at least partially overlapped. The projections of the active layer 4 and the source-drain electrode layer 6 on the substrate 1 are at least partially overlapped, so that the active layer 4, the gate electrode layer 2, the source-drain electrode layer 6 form a dual-capacitor structure on the storage capacitance region II.

In the embodiment, as shown in FIG. 8, a gate insulation layer 8 is further comprised between the gate electrode layer 2 and the active layer 4, and an etch-stopper layer 5 is further comprised between the active layer 4 and the source-drain electrode layer 6. The gate electrode layer 2 comprises a portion in the storage capacitance region II, the gate insulation layer 3 comprises a portion in the storage capacitance region II, the active layer 4 comprises a portion in the storage capacitance region II, the etch-stopper layer 5 comprises a portion in the storage capacitance region II, and the source-drain electrode layer 6 comprises a portion in the storage capacitance region II. In this way, the storage capacitance region II forms a dual-capacitor structure (i.e., the gate electrode layer 2, the gate insulation layer 3 and the active layer 4 form a capacitor and the source-drain electrode layer 6, the etch-stopper layer 5 and the active layer 4 form another capacitor). Storage capacitance is effectively increased when an area occupied by the storage capacitance region II is not increased, which is advantageously to reduce a pixel area and increase PPI.

It should be noticed that the etch-stopper layer 5 can be an insulating layer in any forms.

In this embodiment, the gate insulation layer 3 in the storage capacitance region II is a thinned gate insulation layer. The thinned gate insulation layer can increase the storage capacitance effectively.

In this embodiment, the gate electrode layer 2 at the contact hole 12 in the gate insulation layer 6 is in contact with the source-drain electrode layer 6. The gate electrode layer 2 at the contact hole in the gate insulation layer is in contact with the source-drain electrode layer 6 directly by etching the gate insulation layer 3 at the contact hole in the gate insulation layer, so as to achieve a hole contact between the source-drain electrode layer 6 and the gate electrode layer 2.

Further, at least one passivation layer is formed on the source-drain electrode layer 6. As shown in FIG. 8, a first passivation layer 7, a second passivation layer 8 and a third passivation layer 9 are formed on the source-drain electrode layer 6 sequentially. A material of the passivation layers can be one or more of silicon oxide ($SiO_x$), silicon nitride ($SiN_x$), silicon oxynitride (SiON) or alumina ($Al_2O_3$).

Further, a pixel electrode layer 11 is formed on the passivation layer. The pixel electrode layer 11 is in contact with the source-drain electrode layer 6 by a contact hole 10 in the passivation layers which runs through the passivation layers. A material of the pixel electrode layer 11 is indium tin oxides (ITO) with good conductivity and transparency.

Another embodiment of the disclosure provides a method of manufacturing an array substrate. The method comprises: forming a gate electrode layer 2, an active layer 4 and a source-drain electrode layer 6 on the substrate; the substrate comprises a storage capacitance region thereon.

In the storage region II, projections of the gate electrode layer 2 and the active layer 4 on the substrate 1 are at least partially overlapped, and the projections of the active layer 4 and the source-drain electrode layer 6 on the substrate 1 are at least partially overlapped, so that the active layer 4, the gate electrode layer 2, the source-drain electrode layer 6 form a dual-capacitor structure on the storage capacitance region II.

In this embodiment, the method further comprises forming a gate insulation layer 3 between the gate electrode layer 2 and the active layer 4, and forming an etch-stopper layer 5 between the active layer 4 and the source-drain electrodes layer 6.

When the gate electrode layer 2 is formed, a portion in the storage capacitance region II is formed; when the gate insulation layer 3 is formed, a portion in the storage capacitance region II is formed; when the active layer 4 is formed, a portion in the storage capacitance region II is formed;

when the etch-stopper layer 5 is formed, a portion in the storage capacitance region II is formed; and when the source-drain electrodes layer 6 is formed, a portion in the storage capacitance region II is formed. It should be understood that these portions are also comprised in the storage capacitance region II by designing mask patterns for etching.

It is noticed that other forms of the insulation layer rather than the etch-stopper layer 5 can be formed between the active layer 4 and the source-drain electrodes layer 6 according the type of a device.

As is shown, the disclosure comprises forming the dual-capacitor structure in the storage capacitance region II, so that the storage capacitance is effectively increased when an area occupied by the storage capacitance region II is not increased. It is advantageously to reduce a pixel area and increase PPI. At the same time, a new process does not need to be added because of using the active layer 4 and the etch-stopper layer 5 simultaneously.

In this embodiment, the method further comprises a step of: etching the gate insulation layer 3 in the storage capacitance region II to be thinned.

For example, the gate insulation layer 3 in the storage capacitance region II is etched by an etch mask for the insulation layer, and a thickness of the gate insulation layer 3 in the storage capacitance region II is controlled by controlling an etching time. In this way, the thickness of the insulation layer 3 of the storage capacitance region II is thinned, to increase the storage capacitance and improve the flatness of the storage capacitance region II, which is advantageously to improve performance of a back plate.

Further, while the gate insulation layer 3 of the storage capacitance region II is etched to be thinned, the gate insulation layer 3 at the contact hole to be formed predeterminedly in the gate insulation layer is etched to be thinned. For example, the storage capacitance region II and the gate insulation layer 3 at the contact hole in the gate insulation layer are etched by the etch mask for the insulation layer simultaneously. Because both of them are etched simultaneously, only one mask is needed.

In this embodiment, the method further comprises a step of: forming the etch-stopper layer 5 on the active layer, while etching the gate insulation layer 3 at the contact hole predetermined to be formed in the gate insulation layer again, to reach the gate electrode layer 2. As it can be seen, the insulation layer 3 at the contact hole in the gate insulation layer is formed by two steps. A first step etches the insulation layer 3 at the contact hole in the gate insulation layer while etching the insulation layer in the storage capacitance region II by the etch mask for the insulation layer, so as to thin the thickness of the insulation layer, and a second step etches the insulation layer 3 at the contact hole in the gate insulation layer again to reach the gate electrode layer 2 while forming the etch-stopper layer 5 on the active layer 4.

In this embodiment, the method further comprises: forming at least one passivation layer on the source-drain electrode layer 6.

For example, forming the passivation layer comprises steps of: forming a plurality of passivation layers sequentially by manufacturing methods, such as thermal growth, atmospheric pressure chemical vapor deposition, low pressure chemical vapor deposition, plasma chemical vapor deposition, or sputtering, and a material of the passivation layers is one or more of silicon oxide ($SiO_x$), silicon nitride ($SiN_x$), silicon oxynitride (SiON) or alumina ($Al_2O_3$).

In this embodiment, the method further comprises: forming a contact hole in the at least one passivation layer, the contact hole running through the at least one passivation layer, and forming a pixel electrode layer 11 on the at least one passivation layer. The passivation layer is in contact with the source-drain electrode layer 6 by the contact hole in the passivation layer.

In this embodiment, after forming the pixel electrode layer 11, the method further comprises: curing and annealing the pixel electrode layer 11. For example, the pixel electrode layer 11 is annealed in vacuum, nitrogen, atmosphere or oxygen environment. An annealing temperature is between 120° C. and 450° C. An annealing time lasts 0.5 to 3 hours.

The display device provided by another embodiment of the disclosure comprises above-mentioned array substrate. The display device may be a TV set, a display panel, a tablet computer, a cell phone, a navigator, a camera, or a video camera or any product having a display function.

First Embodiment

Figure 1:
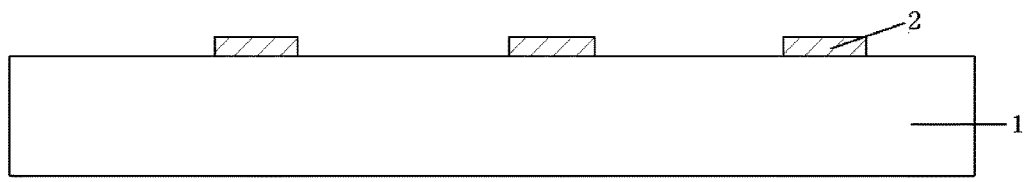
FIG. 1 is a schematic diagram of forming a gate electrode layer of an array substrate provided by an embodiment of the disclosure.
Figure 9:
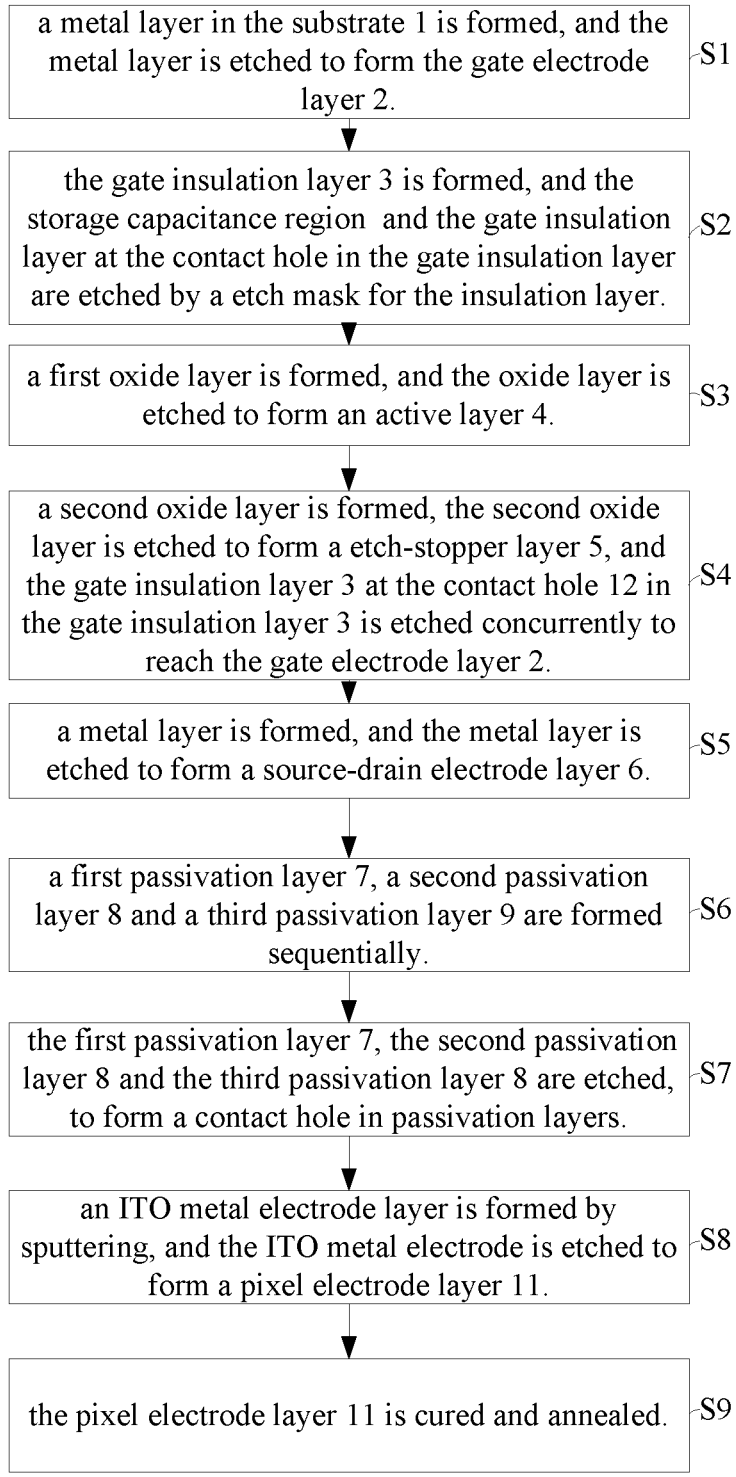
FIG. 9 is a flow chart of a method of manufacturing the array substrate provided by the embodiment of the disclosure.

In order to make technique solutions of the at least one embodiment of the disclosure more clearly, the at least one embodiment will be described in a clearly and fully understandable way in connection with a cross-section schematic view of a structure of a device formed by various steps. In this embodiment, in a final product structure as shown FIG. 8, an array substrate comprises a thin film transistor region I, a storage capacitance region II and a source-drain contact hole region III, i.e. three regions corresponding to three gate electrode layers 2 from left to right in FIG. 8. Of course, the array substrate can comprise other structures, and description of which will be omitted herein. It should be understood that the structures shown herein are only exemplary, and other structures can be adopted according to a scope and spirit defined in claims of the disclosure. As shown in FIG. 9, a manufacturing method of the embodiment can comprises steps of:

S1: a metal layer on the substrate 1 is formed, and the metal layer is etched to form the gate electrode layer 2, as shown in FIG. 1.

For example, the substrate 1 can be a material of glass, plastics, silicon and the like. The metal layer is formed by sputtering metal or alloy, such as molybdenum (Mo), aluminum/neodymium(Al/Nd), aluminum/neodymium/molybdenum (Al/Nd/Mo), molybdenum/aluminum/neodymium/molybdenum (Mo/Al/Nd/Mo), gold/titanium(Au/Ti), platinum/titanium(Pt/Ti) and the like, and the metal layer is lithographed, to form the gate electrode layer 2.

Figure 2:
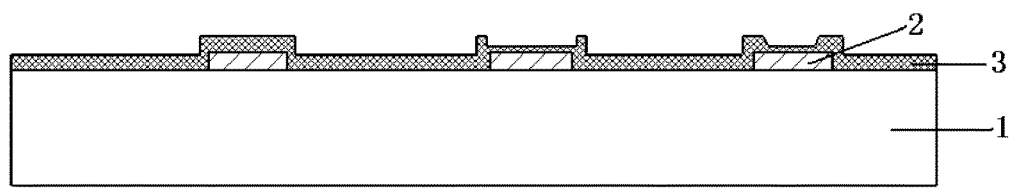
FIG. 2 is a schematic diagram of forming a gate insulation layer provided by the embodiment of the disclosure.

S2: the gate insulation layer 3 is formed, and the storage capacitance region II and the gate insulation layer at the contact hole 12 in the gate insulation layer are etched by a etch mask for the insulation layer, as shown in FIG. 2.

For example, oxides, such as silicon oxide ($SiO_x$), silicon nitride ($SiN_x$), silicon oxynitride (SiON), alumina ($Al_2O_3$), hafnium oxide ($HfO_2$), zirconium oxide ($ZrO_2$), titanium oxide($TiO_2$), Yttrium oxide ($Y_2O_3$), lanthanum oxide ($La_2O_3$), tantalum oxide ($Ta_2O_5$) or the like are deposited by manufacturing methods, such as atmospheric pressure chemical vapor deposition, low pressure chemical vapor deposition, plasma chemical vapor deposition, or sputtering, so as to form one or more gate insulation layers, and the storage capacitance region II and the gate insulation layer at the contact hole 12 in the gate insulation layer are etched simultaneously by the etching mask for the insulation layer.

Figure 3:
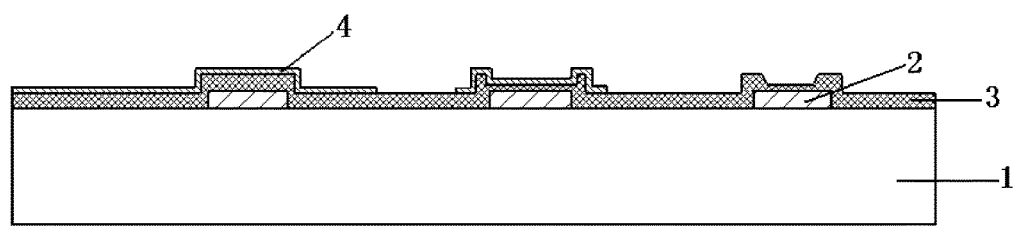
FIG. 3 is a schematic diagram of forming an active layer provided by the embodiment of the disclosure.

S3: a first oxide layer is formed, and the oxide layer is etched to form an active layer 4, as shown in FIG. 3;

For example, oxides, such as indium gallium zinc oxide (IGZO), nitride zinc oxide (ZnON), indium tin zinc oxide (ITZO), zinc tin oxide (ZTO), zinc indium oxide (ZIO), indium gallium oxide (IGO), aluminum zinc tin oxide (AZTO) or the like are deposited by manufacturing methods, such as sputtering, sol-gel, vacuum evaporation, spraying, ink-jet printing to form the first oxide layer, and the first oxide layer is etched to form an active layer 4.

Figure 4:
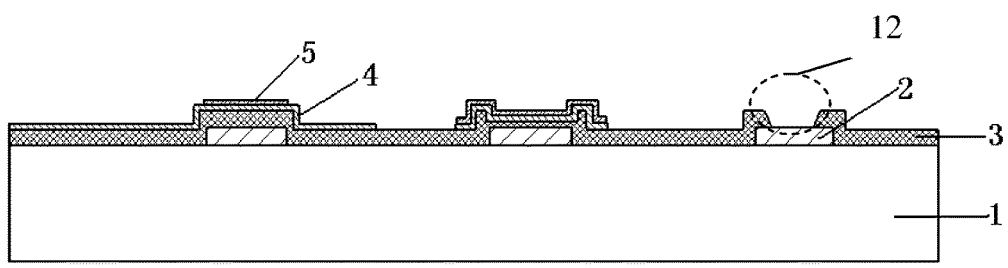
FIG. 4 is a schematic diagram of forming an etch-stopper layer provided by the embodiment of the disclosure.

S4: a second oxide layer is formed, the second oxide layer is etched to form an etch-stopper layer 5, and the gate insulation layer 3 at the contact hole 12 in the gate insulation layer 3 is etched again at the same time to reach the gate electrode layer 2, as shown in FIG. 4.

For example, oxides, such as silicon oxide ($SiO_x$), silicon nitride ($SiN_x$), silicon oxynitride (SiON), alumina ($Al_2O_3$), tetraethyl orthosilicate (TEOS) or the like is deposited by manufacturing methods, such as atomic layer deposition, atmospheric pressure chemical vapor deposition, low pressure chemical vapor deposition, plasma chemical vapor deposition, sputtering, sol-gel or the like, so as to form one or more second oxide layer, and the second oxide layer is etched to form an etch-stopper layer 5 and at the same time, the gate insulation layer 3 at the contact hole 12 in the gate insulation layer is etched to reach the gate electrode layer 2.

Figure 5:
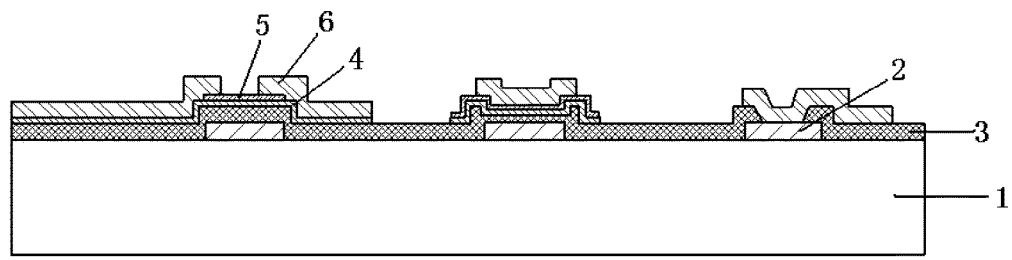
FIG. 5 is a schematic diagram of forming a source-drain electrode layer provided by the embodiment of the disclosure.

S5: a metal layer is formed, and the metal layer is etched to form a source-drain electrode layer 6, as shown in FIG. 5.

For example, metal or alloy, such as molybdenum (Mo), aluminum/neodymium
(Al/Nd), aluminum/neodymium/molybdenum (Al/Nd/Mo), molybdenum/aluminum/neodymium/molybdenum (Mo/Al/Nd/Mo), gold/titanium(Au/Ti), platinum/titanium (Pt/Ti) and the like is deposited by sputtering to form the metal layer, and the metal layer is lithographed, to form the gate electrode layer 2.

Figure 6:
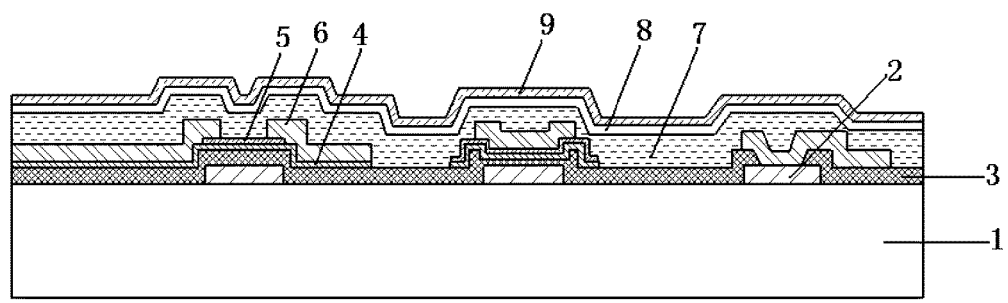
FIG. 6 is a schematic diagram of forming a plurality of passivation layers provided by the embodiment of the disclosure.

S6: a first passivation layer 7, a second passivation layer 8 and a third passivation layer 9 are formed sequentially, as shown in FIG. 6.

For example, the passivation layers are continuously grown by manufacturing method, such as thermal growth, atmospheric pressure chemical vapor deposition, low pressure chemical vapor deposition, plasma chemical vapor deposition, sputtering or the like, and a material of the passivation layers is one or more of silicon oxide $SiO_x$, silicon nitride $SiN_x$, silicon oxynitride SiON, or alumina $Al_2O_3$.

Figure 7:
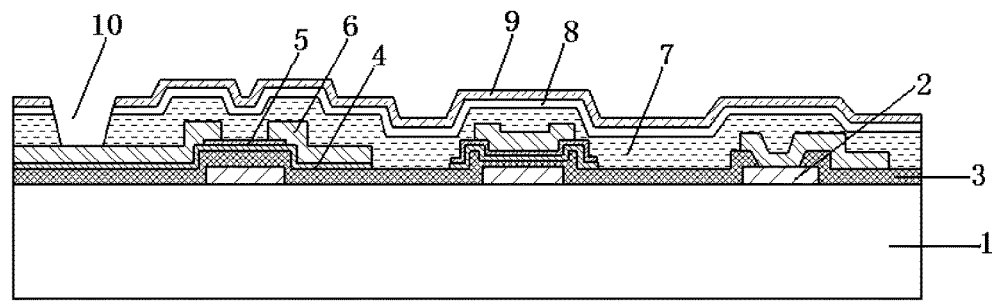
FIG. 7 is a schematic diagram of forming a contact hole provided by the embodiment of the disclosure.

S7: the first passivation layer 7, the second passivation layer 8 and the third passivation layer 8 are etched, to form a contact hole 10 in passivation layers, as shown in FIG. 7.

S8: an ITO metal electrode layer is formed by sputtering, and the ITO metal electrode is etched to form a pixel electrode layer 11, as shown in FIG. 8.

For example, the pixel electrode 11 is in contact with the source-drain electrode layer 6 by the contact hole in the passivation layers.

S9: the pixel electrode layer 11 is cured and annealed.

For example, the pixel electrode layer 11 is annealed in vacuum, nitrogen, atmosphere, oxygen environment. An annealing temperature is between 120° C. and 450° C. An annealing time lasts 0.5 to 3 hours.

The above descriptions are merely exemplary embodiments of the disclosure, and do not restrict the scope of the disclosure. The scope of the disclosure should be defined by accompanying claims.

This application claims the priority of Chinese Patent Application No. 201510132293.3 filed on Mar. 25, 2015, which is hereby incorporated entirely herein by reference.

The invention claimed is:

1. An array substrate, comprising a gate electrode layer, an active layer, and a source-drain electrode layer that are disposed on a substrate,
   wherein the substrate comprises a storage capacitance region thereon, in the storage capacitance region, projections of the gate electrode layer and the active layer on the substrate are at least partially overlapped, and projections of the active layer and the source-drain electrode layer on the substrate are at least partially overlapped,
   wherein the array substrate further comprises a gate insulation layer between the gate electrode layer and the active layer and an etch-stopper layer between the active layer and the source-drain electrode layer,
   wherein the etch-stopper layer is an insulating layer, and
   wherein, in the storage capacitance region, the gate electrode layer and the active layer are spatially separated by the gate insulation layer so as to form a capacitor between them, and the active layer and the source-drain electrode layer are spatially separated by the etch-stopper layer so as to form another capacitor between them,
   wherein the gate electrode layer comprises a portion in the storage capacitance region, the gate insulation layer comprises a portion in the storage capacitance region, the active layer comprises a portion in the storage capacitance region, the etch-stopper layer comprises a portion in the storage capacitance region, and the source-drain electrode layer comprises a portion in the storage capacitance region,
   wherein the substrate further comprises a thin film transistor region, and a thickness of the gate insulation layer formed in the storage capacitance region is smaller than a thickness of the gate insulation layer formed in the thin film transistor region,
   wherein the gate electrode layer at a contact hole in the gate insulation layer is in contact with the source-drain electrode layer.

2. The array substrate of claim 1, wherein at least one passivation layer is formed on the source-drain electrode layer, and a material of the passivation layer is one or more of silicon oxide, silicon nitride, silicon oxynitride, or alumina.

3. The array substrate of claim 2, wherein a pixel electrode layer is formed on the passivation layer, and the pixel electrode layer is in contact with the source-drain electrode layer by a contact hole in the passivation layer which runs through the passivation layer.

4. A display device, comprising the array substrate of claim 1.

5. A method of manufacturing an array substrate, comprising:
   forming a gate electrode layer, an active layer and a source-drain electrode layer on a substrate,
   wherein the substrate comprises a storage capacitance region thereon, in the storage capacitance region, projections of the gate electrode layer and the active layer on the substrate are at least partially overlapped, and projections of the active layer and the source-drain electrode layer on the substrate are at least partially overlapped,
   wherein the method further comprises
   forming a gate insulation layer between the gate electrode layer and the active layer, and
   forming an etch-stopper layer between the active layer and the source-drain electrode layer, wherein the etch-stopper layer is an insulating layer, and wherein, in the storage capacitance region, the gate electrode layer and the active layer are spatially separated by the gate insulation layer so as to form a capacitor between them, and the active layer and the source-drain electrode layer are spatially separated by the etch-stopper layer so as to form another capacitor between them, wherein, upon the gate electrode layer being formed, a portion in the storage capacitance region is formed; upon the gate insulation layer being formed, a portion in the storage capacitance region is formed; upon the active layer being formed, a portion in the storage capacitance region is formed; upon the etch-stopper layer being formed, a portion in the storage capacitance region is formed; and upon the source-drain electrode layer being formed, a portion in the storage capacitance region is formed, wherein the method further comprises etching the gate insulation layer in the storage capacitance region to be thinned, after the gate insulation layer is formed, and wherein the method further comprises etching the gate insulation layer at a contact hole predetermined to be formed in the gate insulation layer to be thinned, while etching the gate insulation layer in the storage capacitance region to be thinned.

6. The method of claim 5, wherein a thickness of the gate insulation layer in the storage capacitance region is controlled by controlling an etching time when the gate insulation layer in the storage capacitance region is etched to be thinned.

7. The method of claim 5, further comprising:
etching the gate insulation layer at the contact hole predetermined to be formed in the gate insulation layer again to reach the gate electrode layer, while forming the etch-stopper layer on the active layer,
wherein the gate electrode layer at the contact hole in the gate insulation layer is in contact with the source-drain electrode layer.

8. The method of claim 5, wherein at least one passivation layer is formed on the source-drain electrode layer, and a material of the passivation layer is one or more of silicon oxide, silicon nitride, silicon oxynitride, or alumina.

9. The method of claim 8, further comprising:
forming a contact hole in the at least one passivation layer which runs through the at least one passivation layer, and
forming a pixel electrode layer on the at least one passivation layer, wherein the pixel electrode layer is in contact with the source-drain electrode layer by the contact hole in the passivation layer.

10. The method of claim 9, wherein the pixel electrode layer is cured and annealed, after the pixel electrode layer is formed.

* * * * *